(12) United States Patent
Manning et al.

(10) Patent No.: US 6,602,778 B2
(45) Date of Patent: *Aug. 5, 2003

(54) APPARATUS AND METHODS FOR COUPLING CONDUCTIVE LEADS OF SEMICONDUCTOR ASSEMBLIES

(75) Inventors: Troy A. Manning, Meridian, ID (US); Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/091,649

(22) Filed: Mar. 5, 2002

(65) Prior Publication Data

US 2002/0089070 A1 Jul. 11, 2002

Related U.S. Application Data

(63) Continuation of application No. 09/687,511, filed on Oct. 12, 2000, now Pat. No. 6,380,635, which is a continuation of application No. 09/143,526, filed on Aug. 28, 1998, now Pat. No. 6,169,331.

(51) Int. Cl.$^7$ ............................................... H01L 21/44
(52) U.S. Cl. .................. 438/617; 438/612; 438/666; 29/840; 29/832; 257/784; 257/786
(58) Field of Search ................................. 438/611–617

(56) References Cited

U.S. PATENT DOCUMENTS

| | | |
|---|---|---|
| 3,623,649 A | 11/1971 | Keisling ..................... 228/15 |
| 3,718,272 A | 2/1973 | Eltzroth et al. ................ 228/3 |
| 4,080,485 A | 3/1978 | Bonkohara ................... 428/620 |
| 4,142,288 A | 3/1979 | Flammer et al. .............. 29/628 |
| 4,241,360 A | 12/1980 | Hambor et al. ............... 357/56 |
| 4,359,754 A | 11/1982 | Hayakawa et al. ........... 357/22 |
| 4,403,240 A | 9/1983 | Seki et al. .................... 357/48 |
| 4,485,957 A | 12/1984 | Sugimoto et al. ............ 228/4.5 |
| 4,750,666 A | 6/1988 | Neugebauer et al. ........ 228/160 |
| 4,765,526 A | 8/1988 | Sato ............................ 228/4.5 |
| 4,925,085 A | 5/1990 | Buxton ........................ 228/179 |
| 4,984,065 A | 1/1991 | Sako ............................ 357/81 |
| 5,036,015 A | 7/1991 | Sandhu et al. |
| 5,058,798 A | 10/1991 | Yamazaki et al. .......... 228/110 |
| 5,081,520 A | 1/1992 | Yoshii et al. ................. 357/80 |
| 5,235,212 A | 8/1993 | Shimizu et al. ............. 257/780 |
| 5,263,246 A | 11/1993 | Aoki ........................... 29/843 |
| 5,298,793 A | 3/1994 | Kotani et al. ............... 257/765 |
| 5,343,064 A | 8/1994 | Spangler et al. ............ 257/350 |
| 5,355,004 A | 10/1994 | Saitoh ........................ 257/211 |
| 5,359,227 A | 10/1994 | Liang et al. ................. 257/784 |
| 5,367,195 A | 11/1994 | DiGiacomo et al. ........ 257/767 |
| 5,371,654 A | 12/1994 | Beaman et al. ............. 361/744 |
| 5,384,487 A | 1/1995 | Rostoker et al. ............ 257/786 |
| 5,492,863 A | 2/1996 | Higgins, III |
| 5,539,251 A | 7/1996 | Iverson et al. .............. 257/670 |
| 5,550,083 A | 8/1996 | Koide et al. |

(List continued on next page.)

*Primary Examiner*—David Nelms
*Assistant Examiner*—D Le
(74) *Attorney, Agent, or Firm*—Dorsey & Whitney LLP

(57) ABSTRACT

A method and apparatus for electrically coupling bond pads on the surface of a microelectronic device. The apparatus can include a microelectronic device having at least two bond pads with a conductive member extending between the bond pads, external to the device. In one embodiment, the conductive member can be connected directly to the bond pads and can extend between the bond pads at or above the surface of the microelectronic device. In another embodiment, the conductive member can be connected on top of another conductive member previously attached to one of the bond pads. The conductive members can be attached to each other or to the bond pads with either ball bonds or wedge bonds to provide electrical signals to selected bond pads of the microelectronic device.

27 Claims, 8 Drawing Sheets

U.S. PATENT DOCUMENTS

| | | | |
|---|---|---|---|
| 5,559,428 A | 9/1996 | Li et al. | 324/71.5 |
| 5,587,607 A | 12/1996 | Yasuda et al. | 257/690 |
| 5,650,914 A | 7/1997 | DiStefano et al. | 361/704 |
| 5,677,574 A | 10/1997 | Hisaka | 257/776 |
| 5,681,647 A | 10/1997 | Caillat | 428/209 |
| 5,712,695 A | 1/1998 | Tanaka et al. | 349/79 |
| 5,723,906 A | 3/1998 | Rush | 257/725 |
| 5,804,876 A | 9/1998 | Lake et al. | 257/737 |
| 5,808,354 A | 9/1998 | Lee et al. | 257/666 |
| 5,817,030 A | 10/1998 | Tarjan et al. | 600/546 |
| 5,818,564 A | 10/1998 | Gray et al. | 349/161 |
| 5,821,624 A | 10/1998 | Pasch | 257/776 |
| 5,828,116 A | 10/1998 | Ao | 257/417 |
| 5,838,072 A | 11/1998 | Li et al. | 257/786 |
| 5,852,871 A | 12/1998 | Khandros | 29/843 |
| 5,854,513 A | 12/1998 | Kim | 257/737 |
| 5,879,530 A | 3/1999 | Caillat | 205/102 |
| 5,909,055 A | 6/1999 | Yamashita et al. | 257/693 |
| 5,923,091 A | 7/1999 | Nagai | 257/777 |
| 5,984,162 A | 11/1999 | Hortaleza et al. | 228/110.1 |
| 5,994,152 A | 11/1999 | Khandros et al. | 436/617 |
| 6,008,533 A | 12/1999 | Bruce et al. | 257/691 |
| 6,008,542 A | 12/1999 | Takamori | 275/773 |
| 6,013,944 A | 1/2000 | Moriya et al. | 257/668 |
| 6,025,651 A | 2/2000 | Nam | 257/788 |
| 6,028,354 A | 2/2000 | Hoffmann | 257/706 |

APPARATUS AND METHODS FOR COUPLING CONDUCTIVE LEADS OF SEMICONDUCTOR ASSEMBLIES

CROSS-REFERENCE TO RELATED APPLICATION

This application is a continuation of U.S. patent application Ser. No. 09/687,511, filed Oct. 12, 2000 now U.S. Pat. No. 6,380,635, which is a continuation of U.S. patent application Ser. No. 09/143,526, filed Aug. 28, 1998 and issued as U.S. Pat. No. 6,169,331 B1 on Jan. 2,2001.

TECHNICAL FIELD

The present invention relates to methods and apparatuses for electrically coupling bond pads of a microelectronic device.

BACKGROUND OF THE INVENTION

Computers and other electronic devices typically include a number of interconnected semiconductor devices. The semiconductor devices include a semiconductor chip or die containing internal circuitry. The dies are generally mounted in a package and connected to other semiconductor devices through external pins or contacts. However, the dies may also be connected directly to other circuitry, including another semiconductor die.

FIG. 1A is a side elevation view of a portion of a semiconductor die 20 having two bond pads 21 (shown as 21a and 21b) on a surface of the die. The bond pads 21 may be coupled to each other with circuitry 53 that is internal to the semiconductor die 20, as shown schematically in FIG. 1A. One bond pad 21a is electrically coupled with a wire 50 to a lead finger 43 of a conductive lead frame 40. In one conventional arrangement, one end of the wire 50 is bonded to the bond pad 21a with a "ball bond" 60 and the other end of the wire 50 is bonded to the lead finger 43 with a "wedge bond" 70. The semiconductor die 20 and the lead frame 40 may then be encapsulated in a plastic material (not shown) and ends 42 of adjacent lead fingers 43 (one of which is shown in FIG. 1A) may be bent downward to form connection pins. The pins may be inserted into corresponding sockets of another device (not shown) to couple the semiconductor die with the other device.

FIG. 1B is an enlarged side elevation view of a portion of the semiconductor die 20 shown in FIG. 1A, as the wire 50 is being attached to the bond pad 21a. The wire 50 can be attached with a wire bonding tool 30 (shown in FIG. 1B as a ball/wedge bonder 30a) by feeding the wire 50 downwardly through an aperture 31 of the ball/wedge bonder 30a and forming a wire ball 51 at the end of the wire 50. The ball/wedge bonder 30a then presses the wire ball 51 against the bond pad 21a while the remainder of the wire 50 extends approximately normal to the bond pad 21a. The bonder 30a then applies heat and/or pressure to the wire 50 at the wire ball 51 to bond the wire to the bond pad 21a, forming the ball bond 60 shown in FIG. 1A. For example, the bonder 30a can use a thermosonic or thermocompression process to apply both heat and pressure to the wire 50. The bonder 30a then moves along the wire 50 to the lead finger 43 and presses the wire 50 against the lead finger 43. The bonder again applies heat and/or pressure to the wire 50 to both bond the wire 50 to the lead frame 40 (forming the wedge bond 70 shown in FIG. 1A), and separate the bonded portion of the wire 50 from a remaining portion of the wire.

FIG. 2A is a side elevation view of the semiconductor die 20 having the wire 50 connected between the bond pad 21a and the lead finger 43 in accordance with another conventional arrangement in which a first wedge bond 70a is formed at the bond pad 21a and a second wedge bond 70b is formed at the lead finger 43. FIG. 2B is an enlarged side elevation view of a portion of the semiconductor die 20 shown in FIG. 2A as the wire 50 is being attached to the bond pad 21a.

Referring to FIG. 2B, the wire 50 can be attached to the bond pad 21a with a wedge/wedge bonder 30b by feeding the wire 50 through an aperture 31a of the wedge/wedge bonder 30b and pressing the wire 50 against the bond pad 21a. The wedge/wedge bonder 30b then applies heat and/or pressure to the wire 50 to bond the wire to the bond pad 21a, forming the first wedge bond 70a shown in FIG. 2A. The bonder 30b then moves along the wire 50 to the lead finger 43 and presses the wire against the lead finger 43. The bonder 30b again applies heat and/or pressure to the wire to bond the wire 50 to the lead finger 43, forming the second wedge bond 70b shown in FIG. 2A. In one conventional arrangement, the bonder 30b can apply sufficient heat and/or pressure to both bond the wire 50 to the lead frame 40 and separate the bonded wire from the remaining supply of wire. In another conventional arrangement, the bonded wire can be separated from the remaining wire by clipping the wire next to the second wedge bond 70b.

As discussed above, two or more bond pads 21 may be connected within the die 20 by internal circuitry 53. The internal circuitry 53 may include very small conductive lines. One drawback with this arrangement is that the conductive lines may have a high resistance, increasing the current necessary to transmit signals between the bond pads, and increasing the heat generated by each semiconductor die. In addition, internal circuitry 53 is inaccessible once the die has been manufactured. Accordingly, another drawback with conventional arrangements is that they may lack the flexibility for interconnecting bond pads that are not connected by the internal circuitry at the time of manufacture.

Yet a further drawback with the conventional methods and devices discussed above is that it may be difficult to route wires between the lead frame 40 and bond pads that are not proximate to the lead frame 40. For example, if one or more of the wires 50 is particularly long, so as to reach a particular bond pad, the wire may be more likely to break or contact other adjacent wires, creating a short circuit that can affect the operation of the semiconductor device.

SUMMARY OF THE INVENTION

The present invention is directed toward methods and apparatuses for electrically coupling bond pads of a microelectronic device. In one aspect of the invention, the apparatus can include first and second spaced apart bond pads on a surface of a microelectronic device. The microelectronic device can further include a conductive member connected to and extending between the first and second bond pads. The conductive member can be positioned on or above the surface of the microelectronic device. In one aspect of the invention, the conductive member can include a wire, and, in another aspect of the invention, the conductive member can include a flowable conductive material, such as a conductive epoxy. In still another aspect of the invention, the microelectronic device can include an insulating material between the conductive member and the surface of the microelectronic device.

In yet another aspect of the invention, the apparatus can include a microelectronic device having at least one bond pad for receiving wire connections. The microelectronic device can further include two wires connected to the same bond pad, for example, a first wire connected at one end to the bond pad with a first bond and a second wire connected at one end to the first bond with a second bond. Either or both of the first and second bonds can be a wedge bond or a ball bond, and the opposite ends of the first and second wires can be connected to other bond pads of the microelectronic device, or to external structures.

DETAILED DESCRIPTION OF THE INVENTION

The present invention is directed toward methods and apparatuses for conductively linking bond pads of microelectronic devices. The apparatus can include a microelectronic device having wires bonded between bond pads of a single device or between the bond pads of two devices. The wires can be bonded to the bond pads using various combinations of ball bonds, wedge bonds and other types of bonds. Many specific details of certain embodiments of the invention are set forth in the following description and in FIGS. 3A–8 to provide a further understanding of such embodiments. One skilled in the art, however, will understand that the present invention may have additional embodiments and that they may be practiced without several of the details described in the following description.

Figure 1A:
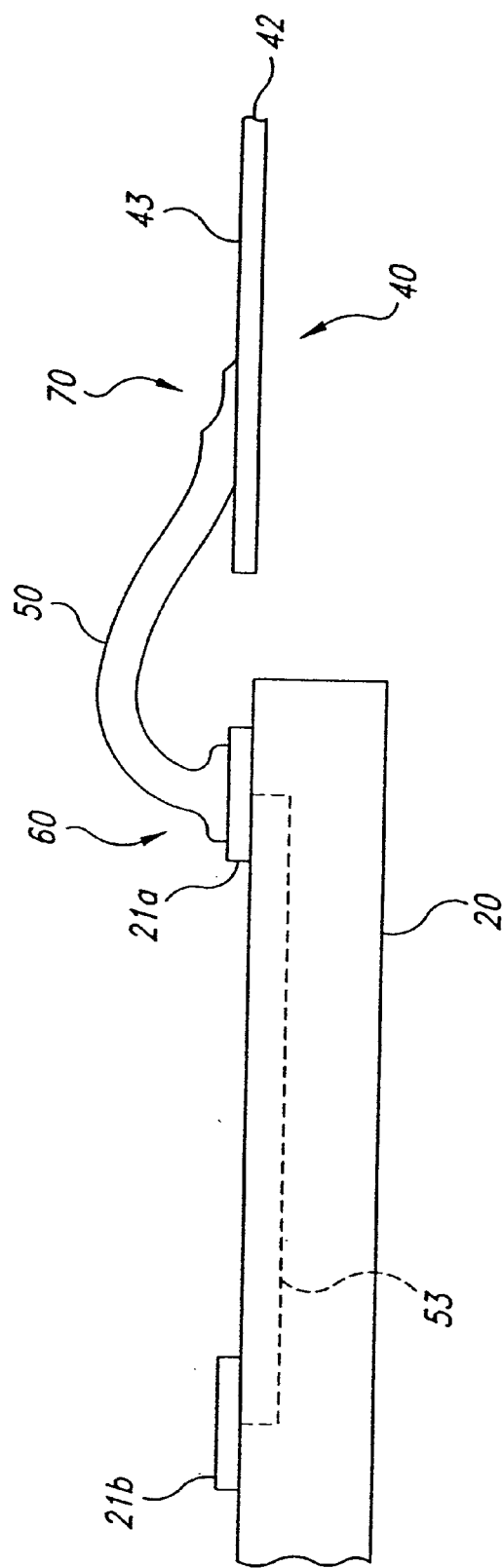
FIG. 1A is a side elevation view of a portion of a semiconductor die and lead frame in accordance with the prior art.
Figure 1B:
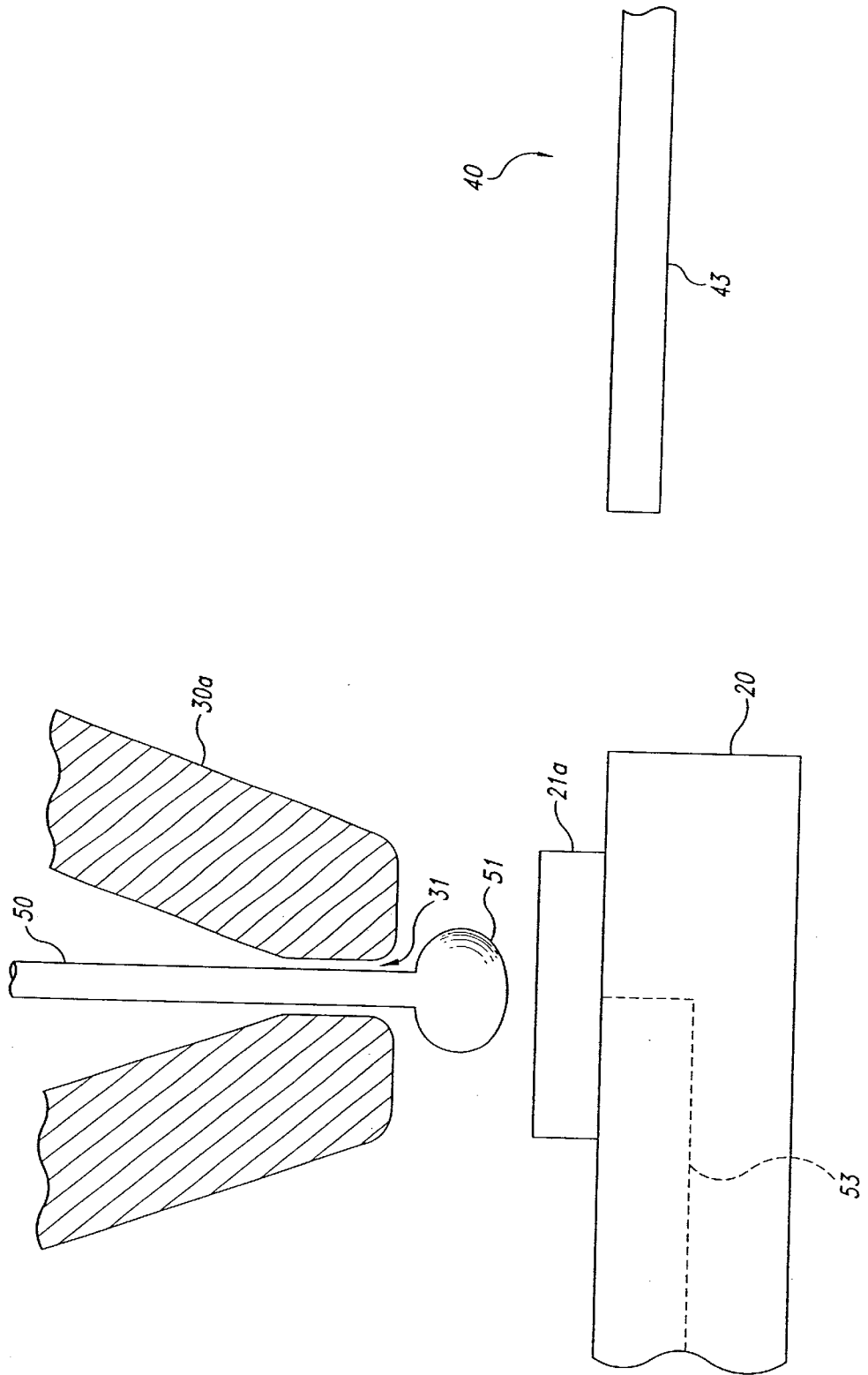
FIG. 1B is an enlarged partial cross-sectional side elevation view of a portion of the semiconductor die and the lead frame shown in FIG. 1A adjacent a wire bonding tool in accordance with the prior art.
Figure 2A:
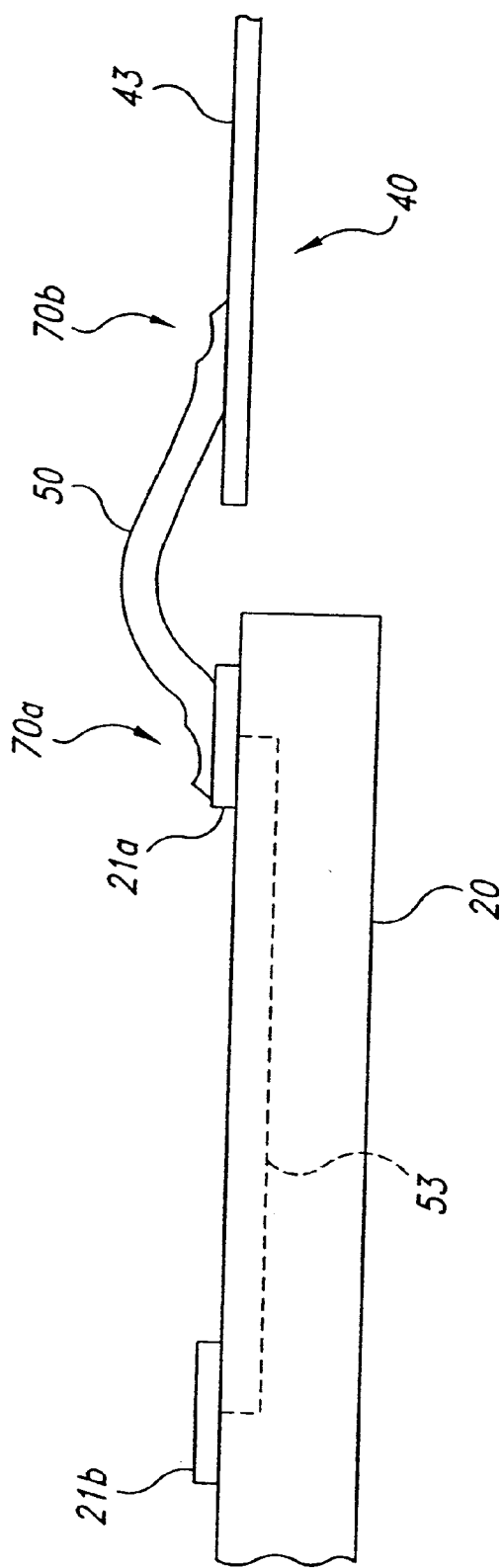
FIG. 2A is a side elevation view of a semiconductor die and lead frame in accordance with another embodiment of the prior art.
Figure 2B:
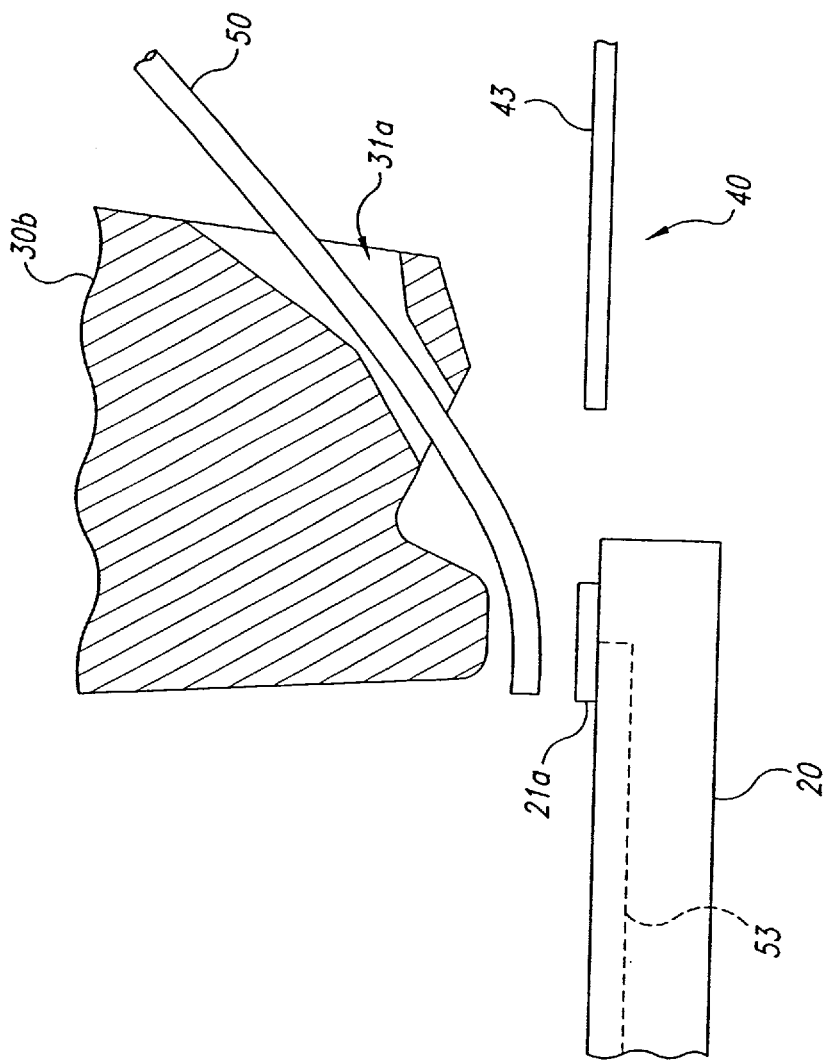
FIG. 2B is an enlarged partial cross-sectional side elevation view of a portion of the semiconductor die and the lead frame shown in FIG. 2A adjacent a wire bonding tool in accordance with another embodiment of the prior art.
Figure 3A:
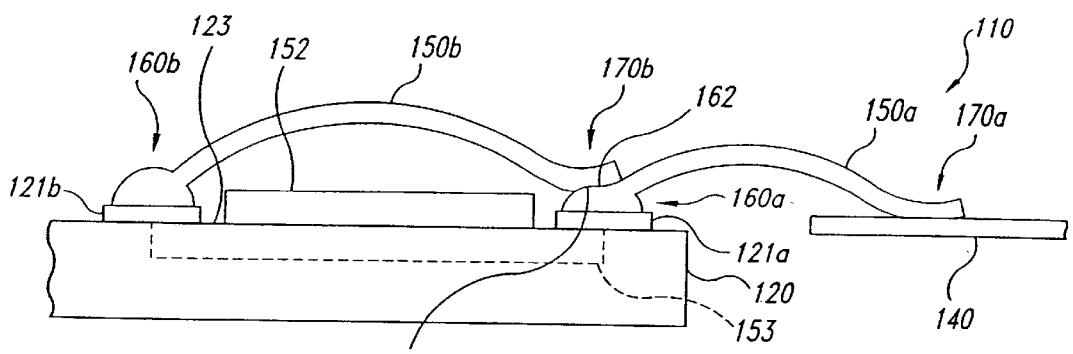
FIG. 3A is a side elevation view of a portion of a microelectronic device assembly having a bond pad with a ball bond and a wedge bond on top of the ball bond in accordance with an embodiment of the invention.

FIG. 3A is a side elevation view of a portion of a microelectronic device assembly 110 in accordance with an embodiment of the invention. The assembly 110 can include a microelectronic device 120 having bond pads 121 (shown as a first bond pad 121a and a second bond pad 121b) on an upper surface 123 of the microelectronic device 120. The bond pads 121 can be connected to each other or to external structures with conductive members 150 (shown as a first conductive member 150a and a second conductive member 150b) that are positioned external to the upper surface 123 of the microelectronic device 120. In one embodiment, the conductive members 150 can include wires made from aluminum, gold or other conductive materials, and in other embodiments, the conductive members 150 can include other structures and materials.

In one embodiment, the first conductive member 150a can be connected between the first bond pad 121a and an adjacent conductive structure, such as a lead frame 140. In one aspect of this embodiment, the first conductive member 150a can be connected to the first bond pad 121a with a ball bond 160a and can be connected to the lead frame 140 with a wedge bond 170a. The ball bond 160a can be made by forming an enlarged region at one end of the first conductive member 150a and then engaging the enlarged region with the bond pad 160a and applying heat and/or pressure to the first conductive member 150a and/or the bond pad 121a. The wedge bond 170a can be formed by engaging a side surface near the other end of the first conductive member 150a with the lead frame 140 and applying heat and/or pressure to the first conductive member 150a and/or the lead frame 140. Suitable devices for forming both the ball bond 160a and the wedge bond 170a are available from Small Precision Tools of Petaluma, Calif.

The bond pads 121a and 121b can be connected to each other with the second conductive member 150b. Accordingly, the second conductive member 150b can include a second ball bond 160b at the second bond pad 121b and a second wedge bond 170b at the first bond pad 121a. In one embodiment, a lower surface 171 of the second wedge bond 170b can be adjacent an upper surface 162 of the first ball bond 160a. In another embodiment, the second wedge bond 170b can be adjacent the first ball bond 160a in a side-by-side arrangement, for example, where the first bond pad 121a is large enough to permit such an arrangement.

An advantage of the assembly 110 shown in FIG. 3A is that the second conductive member 150b can provide a conductive link between the bond pads 121a and 121b without changing the internal circuitry of the microelectronic device 120. This can be advantageous where no internal connections couple the bond pads 121a and 121b at the time the microelectronic device 120 is manufactured, and where the conductive link provided by the second conductive member 150b can be used to modify or repair the microelectronic device 120 after it has been manufactured.

Alternatively, where a conductive path does exist between the two bond pads 121a and 121b (for example, a metal layer or other internal circuitry 153 shown schematically in FIG. 3A), the second conductive member 150b can supplement the internal circuitry 153. In one embodiment, the second conductive member 150b can be relatively large when compared to the internal circuitry 153 and can accordingly reduce electrical resistance between the two bond pads 121a and 121b, increasing current flow and signal speed between the bond pads and decreasing the amount of heat generated by the microelectronic device 120.

Another advantage is that in one embodiment, at least some of the internal connections of the microelectronic device 120 can be eliminated and replaced with the external second conductive member 150b. This arrangement can make volume available within the microelectronic device 120 for other circuit elements, potentially increasing the capability of the microelectronic device 120.

Still another advantage is that a variety of microelectronic devices 120 can be made compatible with a single lead frame configuration, or conversely, a variety of lead frames 140 can be made compatible with a single microelectronic device configuration. For example, where the portion of the lead frame 140 shown in FIG. 3A is configured to be proximate to the first bond pad 121a, and a later version of the microelectronic device 120 requires that the signal produced at that portion of the lead frame 140 be transmitted to the second bond pad 121b, the second conductive member 150b can be used to route the signal to the second bond pad 121b.

Yet another advantage is that the second conductive member 150b can be selectively sized to affect the capacitance of circuits that include the first and second bond pads 121a and 121b. For example, the distance between the second conductive member 150b and the microelectronic device 120 can be varied and/or a dielectric material 152 can be positioned between the second conductive member 150b and the microelectronic device 120 to adjust the capacitance of selected circuits in the microelectronic device 120.

Figure 3B:
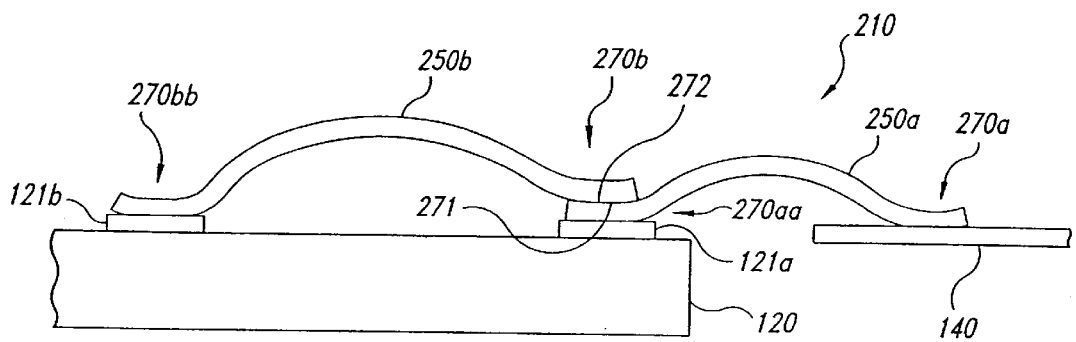
FIG. 3B is a side elevation view of a portion of a microelectronic device assembly having a bond pad with two wedge bonds attached to the bond pad in accordance with another embodiment of the invention.

FIG. 3B is a side elevation view of a portion of a microelectronic device assembly 210 having two wedge bonds 270aa and 270b attached to the first bond pad 121a in accordance with another embodiment of the invention. As shown in FIG. 3B, one end of a first conductive member 250a can be attached to the first bond pad 121a with the first wedge bond 270aa, and the other end of the first conductive member 250a can be attached to the lead frame 140 with a second wedge bond 270a. A second conductive member 250b can be connected between the first bond pad 121a and the second bond pad 121b with a third wedge bond 270b and a fourth wedge bond 270bb. In one embodiment, a lower surface 271 of the third wedge bond 270b engages an upper surface 272 of the first wedge bond 270aa. In another embodiment, the first wedge bond 270aa can be placed on top of the third wedge bond 270b, or the wedge bonds 270aa and 270b can be placed side by side, as discussed above with reference to FIG. 3A.

An advantage of the arrangement shown in FIG. 3B is that it may be easier to form wedge bonds than it is to form ball bonds because the wedge bonds do not require forming an enlarged portion at the end of the wire. Conversely, an advantage of the arrangement shown in FIG. 3A is that once the ball bond is formed at one end of the conductive member 150, the other end of the conductive member can be positioned in any direction relative to the ball bond, whereas in the arrangement shown in FIG. 3B, the tool that forms wedge bonds at both ends of the conductive members 250 can generally move in only one direction.

Furthermore, the ball bonds may be less likely than the wedge bonds to damage the structure to which they are attached. Accordingly, it may be advantageous to apply a ball bond to the relatively small bond pads 121 of the microelectronic device 120, and apply wedge bonds to the larger and more robust lead frames 140 (as shown in FIG. 3A). However, this difference between the arrangements shown in FIG. 3A and FIG. 3B may be less important where the tool forming the wedge bond clips the conductive member adjacent the wedge bond rather than deforming the conductive member to separate it from the wedge bond. In either case, the bond that is formed first on the bond pad 121, whether it is a wedge bond or a ball bond, can provide a support structure that protects the bond pad 121 from damage which might otherwise be incurred by the bonding tool.

Figure 3C:
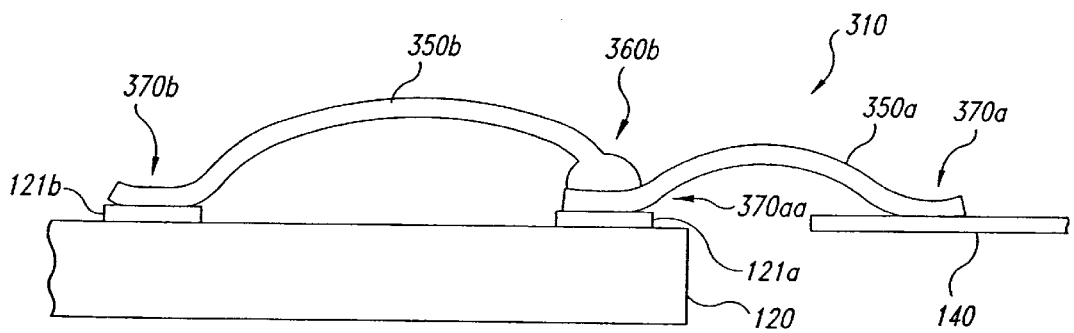
FIG. 3C is a side elevation view of a portion of a microelectronic device assembly having a bond pad with a wedge bond and a ball bond on top of the wedge bond in accordance with still another embodiment of the invention.

In other embodiments, other combinations of ball bonds and wedge bonds may be used to connect a bond pad 121 on one portion of a microelectronic device 120 with a bond pad 121 on another portion of the microelectronic device 120. For example, FIG. 3C is a side elevation view of a portion of a microelectronic device assembly 310 with a first conductive member 350a coupled to the lead frame 140 with a first wedge bond 370a and coupled to the first bond pad 121a with a second wedge bond 370aa. A second conductive member 350b can be coupled to the first bond pad 121a with a ball bond 360b on top of the second wedge bond 370aa, and can be coupled to the second bond pad 121b with a third wedge bond 370b.

Figure 3D:
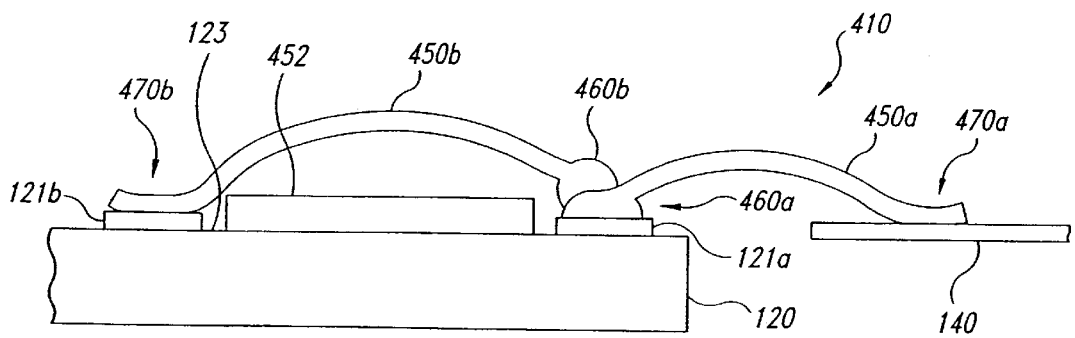
FIG. 3D is a side elevation view of a portion of a microelectronic device assembly having a bond pad with two ball bonds attached to the bond pad in accordance with yet another embodiment of the invention.

FIG. 3D is a side elevation view of a portion of yet another microelectronic device assembly 410 having a first conductive member 450a connected at one end to the first bond pad 121a with a first ball bond 460a and connected at the opposite end to the lead frame 140 with a first wedge bond 470a. A second conductive member 450b can be coupled to the first bond pad 121a with a second ball bond 460b that is positioned on top of the first ball bond 460a. The second conductive member 450b can then be connected to the second bond pad 121b with a second wedge bond 470b.

As shown in FIG. 3D, the assembly 410 can also include an insulator 452 positioned between the second conductive member 450b and the upper surface 123 of the microelectronic device 120. In one embodiment, the insulator 452 can include a polyimide and in other embodiments the insulator 452 can include other non-conductive materials. The insulator 452 can reduce the likelihood of contact between the second conductive member 450b and conductive structures (not shown) on the upper surface 123 of the microelectronic device 120.

Figure 3E:
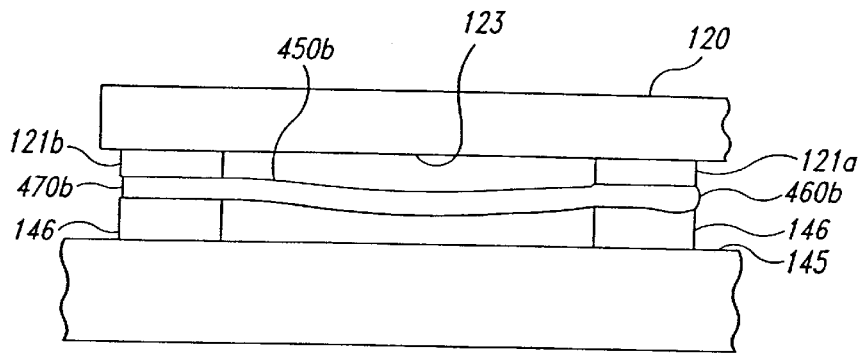
FIG. 3E is a side elevation view of a microelectronic device assembly in accordance with another embodiment of the invention.

In still a further embodiment shown in FIG. 3E, one or both of the bond pads 121 can be coupled directly to an external device without the first conductive member 450a. For example, in a "flip chip" embodiment, the microelectronic device 120 can be inverted and placed face down on a substrate 145 such that the upper surface 123 of the microelectronic device 120 faces the substrate 145 with the second ball bond 460b and the second wedge bond 470b connected directly to contacts 146 on the substrate 145. In other embodiments, this type of arrangement can include any of the bonding configurations shown in FIGS. 3A–3C.

Figure 4:
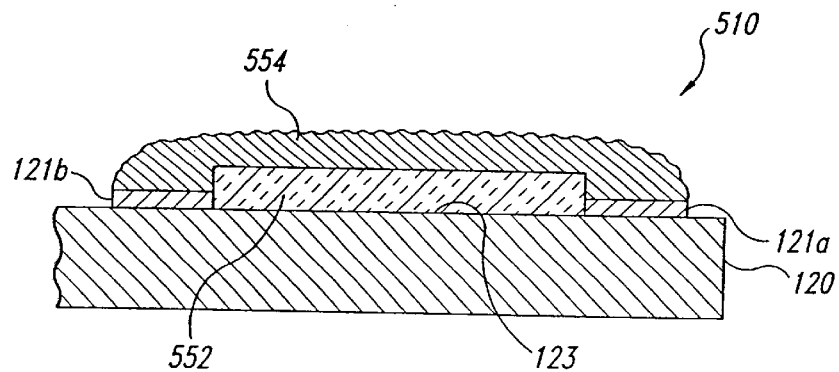
FIG. 4 is a cross-sectional side elevation view of a portion of a microelectronic device assembly having two bond pads connected to each other with a flowable conductive material in accordance with still another embodiment of the invention.

FIG. 4 is a cross-sectional side elevation view of a portion of a microelectronic device assembly 510 having two bond pads 121a and 121b directly connected with a flowable conductive material 554 in accordance with still another embodiment of the invention. In one embodiment, the conductive material 554 can include an epoxy having a suspension of conductive particles, such as silver, that create a conductive path between the bond pads 121. The epoxy can be applied in a liquid or paste form that then hardens to form a permanent connection between the bond pads. In other embodiments, other materials can be used to connect the bond pads 121, so long as they provide a conductive path between the bond pads.

The microelectronic device assembly 510 shown in FIG. 4 can also include an insulator 552 between the conductive material 554 and the upper surface 123 of the microelectronic device 120. As discussed above with reference to FIG. 3D, the insulator 552 can prevent electrical contact between the conductive material 554 and structures on the upper surface 123 of the microelectronic device 120.

An advantage of the assembly 510 shown in FIG. 4 is that it may be easier to apply the flowable conductive material 554 to the microelectronic device 120 than it is to attach the conductive members shown in FIGS. 3A–3D. For example, an applicator used to dispense the conductive material 554 can travel in any direction once initial contact has been made with one of the bond pads 121. Furthermore, the conductive material 554 may not require heat or pressure to form a bond with the bonds pads 121, reducing the likelihood of damaging either the bond pads 121 or the microelectronic device 120 in the region of the bond pads. Conversely, an advantage of the conductive members shown in FIGS. 3A–3D is that they may be more conductive than the conductive material 554, thereby providing faster signal speeds and less heat than the conductive material 554.

Figure 5:
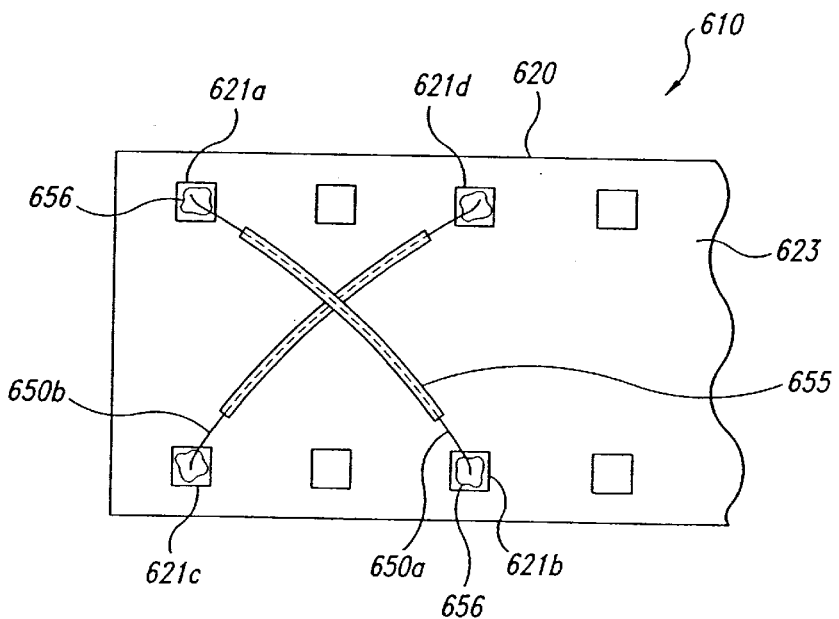
FIG. 5 is a top plan view of a portion of a microelectronic device assembly having two crossing conductive members extending between bond pads of the assembly.

FIG. 5 is a top plan view of a portion of a microelectronic device assembly 610 having a microelectronic device 620 with two crossing conductive members 650 (shown as a first conductive member 650a and a second conductive member 650b) connected between four bond pads 621 (shown as 621a–621d) of the microelectronic device 620. In one embodiment, the first conductive member 650a can be coupled between first and second bond pads 621a and 621b, and the second conductive member 650b can be coupled between third and fourth bond pads 621c and 621d such that two conductive members 650 cross over each other. In one aspect of this embodiment, one or both of the conductive members 650 can include an insulating layer 655 to prevent inadvertent electrical contact between the conductive members 650. Alternatively, insulators such as those shown in FIGS. 3D and 4 can be positioned between the first and second conductive members 650a and 650b, and/or between the conductive members and an upper surface 623 of the microelectronic device 620.

In one embodiment, wire bumps 656 can be disposed on the bond pads 621 beneath the conductive members 650 to reduce the likelihood of damaging the bond pads 621 when the conductive members 650 are coupled to the bond pads 621. Details of the wire bumps 656 and the application of the wire bumps to the bond pads 620 are disclosed in copending U.S. patent application Ser. No. 08/840,604, incorporated herein in its entirety by reference. Alternatively, where the bond pads 621 are connected to external devices, such as a lead frame, the conductive members 650 can be coupled to the bond pads 621 by attaching the conductive members on top of the bonds of other conductive members, in a manner generally similar to that shown in FIGS. 3A–3D. In still another embodiment, the conductive members 650 can be bonded directly to the corresponding bond pads 121 without any intermediate structures.

Figure 6:
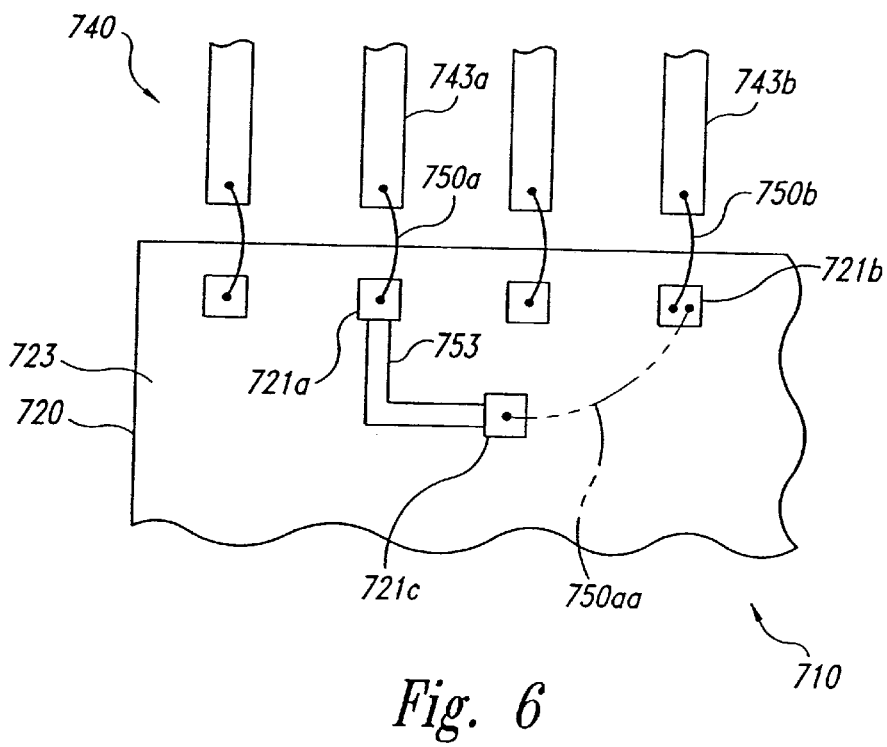
FIG. 6 is a top plan view of a microelectronic device assembly having conductive members extending between bond pads of the microelectronic device assembly in accordance with still another embodiment of the invention.

FIG. 6 is a top plan view of a microelectronic device assembly 710 that includes a microelectronic substrate 720 having bond pads 721 (shown as a first bond pad 721a and a second bond pad 721b). The assembly 710 further includes a lead frame 740 having lead fingers 743 (shown as a first lead finger 743a and a second lead finger 743b) positioned adjacent the microelectronic device 720. Each lead finger 743 may be coupled with a conductive member to a corresponding bond pad 721. For example, the first lead finger 743a can be coupled to the first bond pad 721a with a first conductive member 750a, and the second lead finger 743b can be coupled to the second bond pad 721b with a second conductive member 750b.

Alternatively, the second bond pad 721b can be coupled to the first lead finger 743a via a third conductive member 750aa, shown in dashed lines in FIG. 6. For example, the first lead finger 743a can be connected to the first bond pad 721a, as discussed above, and the first bond pad 721a can be connected to an auxiliary bond pad 721c with a conductive element 753, such as a flat metal layer 753. The conductive element 753 can be positioned either above, on, or below an upper surface 723 of the microelectronic device 720, and the auxiliary bond pad 721c can be connected to one end of the third conductive member 750aa. Accordingly, the conductive element 753, the auxiliary bond pad 721c, and the third conductive member 750aa can provide a connection between the second bond pad 721b and the first lead finger 743a.

An advantage of the assembly 710 shown in FIG. 6 is that the auxiliary bond pad 721c allows the second bond pad 721b to be coupled to the first lead finger 743a without routing the third conductive member 750aa over other lead fingers or over other bond pads. Accordingly, the assembly 710 can reduce the likelihood that the third conductive member 750aa will contact or otherwise interfere with other bond pads or lead fingers of the assembly 710.

Another advantage of the assembly 710 shown in FIG. 6 is that the auxiliary bond pad 721c can be positioned on the microelectronic device 720 such that the length of the third conductive member 750aa is less than it would be if it were to extend all the way to the first lead finger 743a. Accordingly, the third conductive member 750aa may be less likely to make electrical contact with other structures of the microelectronic device 720, and may be less likely to become entangled or otherwise engaged with such structures, which might damage the third conductive member 750aa. Furthermore, by placing the auxiliary bond pad 721c near the second bond pad 721b, the third conductive member 750aa may be more nearly "vertical" (as seen FIG. 6) near the second bond pad 721b, which may reduce stresses at the bond between the third conductive member 750aa and the second bond pad 721b.

Figure 7:
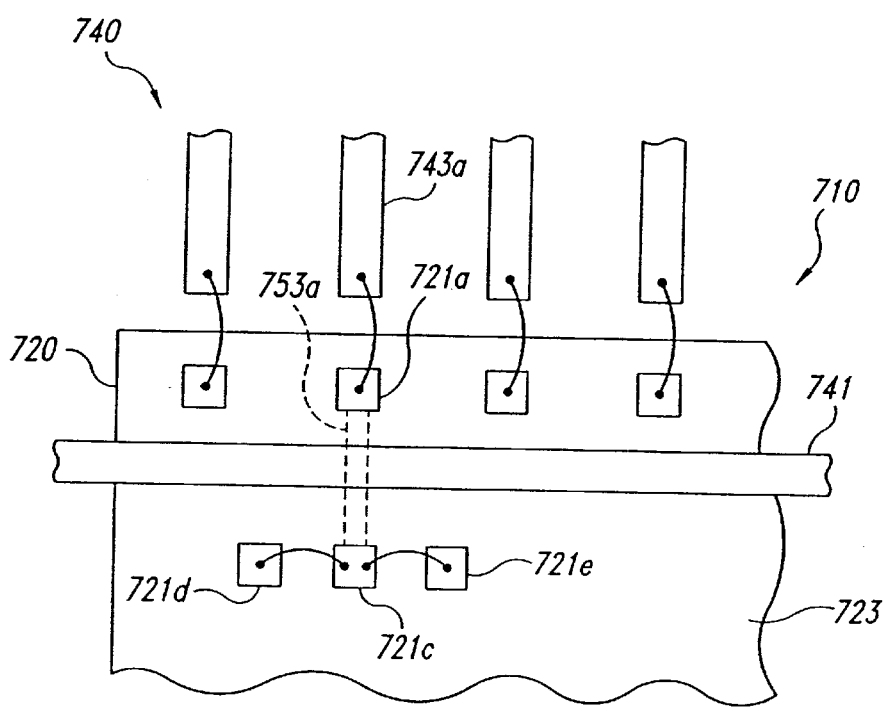
FIG. 7 is a top plan view of a microelectronic device assembly having a conductive member extending beneath a support portion of a lead frame in accordance with another embodiment of the invention.

FIG. 7 is a top plan view of another embodiment of the assembly 710 in which the lead frame 740 includes a bar or a bus 741 that extends over the upper surface 723 of the microelectronic device 720. Accordingly, the microelectronic device 720 can include a metal layer 753a that extends between the first bond pad 721a and the auxiliary bond pad 721c beneath the upper surface 723 of the microelectronic device 720 so as not to contact the bus 741. For example, in one embodiment, the metal layer 753a can be disposed beneath the upper surface 723 of the microelectronic device 720 during fabrication of the microelectronic device.

The microelectronic device 720 can further include third and fourth bond pads 721d and 721e that can be selectively coupled to the auxiliary bond pad 721c using any of the techniques described above with reference to FIGS. 3A–5. For example, in one embodiment, the third bond pad 721d can be connected to the auxiliary bond pad 721c to produce a desired operating characteristic, such as an operating voltage, in the microelectronic device 720. Alternatively, the fourth bond pad 721e can be connected to the auxiliary bond pad 721c to produce a different operating characteristic in the microelectronic device 720. In still another arrangement, both the third and fourth bond pads 721d and 721e can be connected simultaneously to the auxiliary bond pad 721c. Accordingly, an advantage of the assembly 710 shown in FIG. 7 is that the combination of the metal layer 753a and the auxiliary bond pad 721c can be used to route signals from the first lead finger 743a to one or more bond pads that are not adjacent the lead finger 743a. In alternate embodiments, the metal layer 753a can be replaced with insulated conductive members, such as those shown in FIG. 5, or other structures that similarly extend between the first bond pad 721a and the auxiliary bond pad 721c without making electrical contact with the bar 741.

Figure 8:
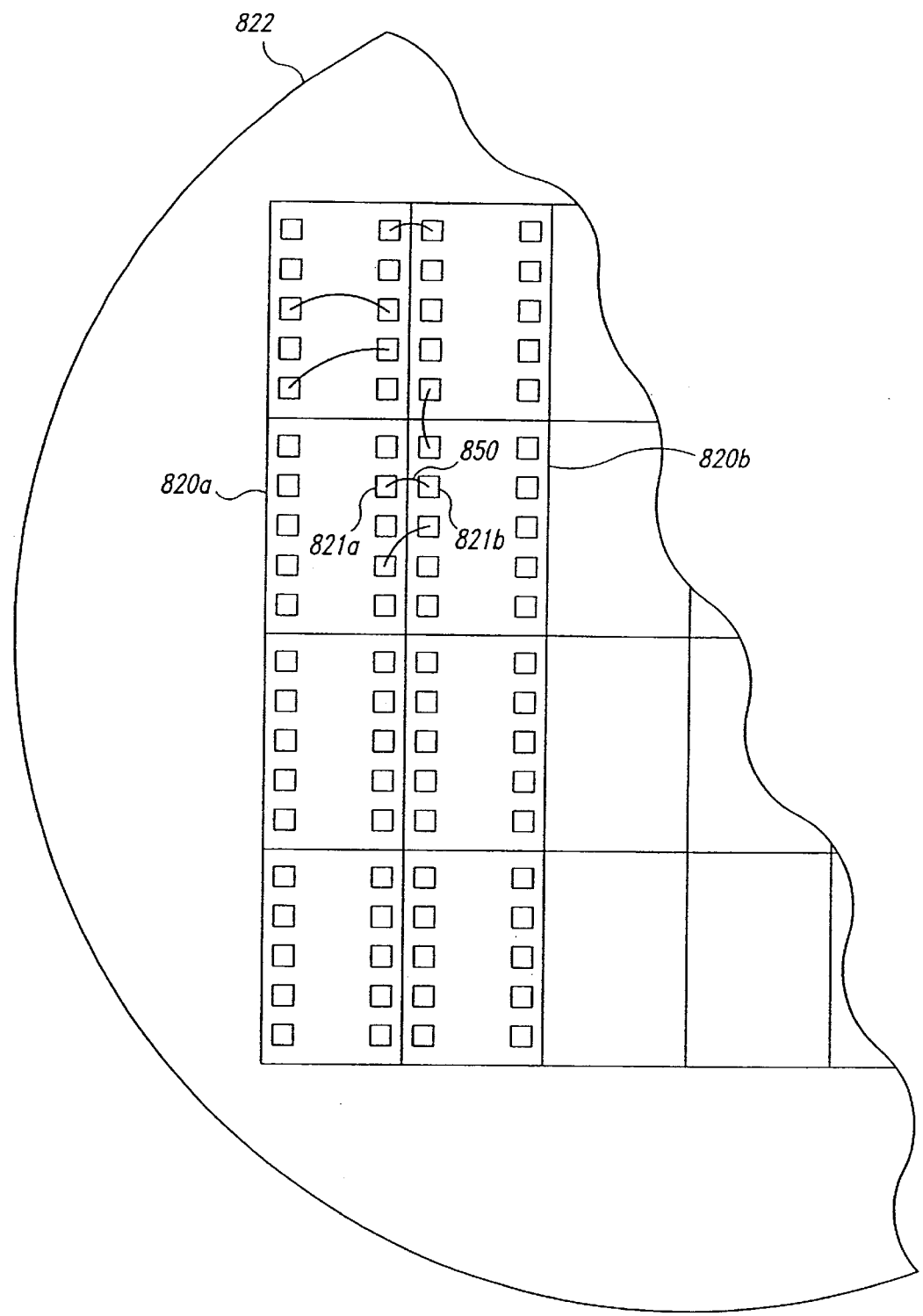
FIG. 8 is a top plan view of a wafer having a plurality of interconnected microelectronic dies in accordance with yet another embodiment of the invention.

FIG. 8 is a top plan view of a microelectronic wafer 822 having a plurality of microelectronic dies 820, including a first microelectronic die 820a and a second microelectronic die 820b. The first die 820a can include a first bond pad 821a and the second die 820b can include a second bond pad 821b. A conductive member 850 can be connected between the bond pads 820a and 820b to interconnect microelectronic dies positioned on the wafer 822.

An advantage of the embodiment shown in FIG. 8 is that two or more microelectronic dies 820 can be connected to each other to form a larger device before the dies 820 are separated from the wafer 822. For example, several memory dies can be connected to form a device having a larger memory capacity. Accordingly, the dies 820 form building blocks and the same die design can be used for both relatively small and relatively large memory devices. By connecting the dies of the relatively large device before the dies are separated, the individual dies need not be separated at all, reducing the likelihood that the dies will be damaged during separation. Furthermore, this arrangement virtually eliminates the possibility that the dies will be misaligned relative to each other when they are connected together.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for electrically coupling first and second bond pads of a semiconductor device, comprising:
    attaching a first conductive lead to the first bond pad toward a first end of the first conductive lead;
    attaching the first conductive lead to the second bond pad toward a second end of the first conductive lead so that the first conductive lead extends between the first and second bond pads proximate to and external to a surface of the semiconductor device; and
    attaching a second conductive lead to at least one of the first and second bond pads.

2. The method of claim 1 wherein attaching the first conductive lead to the first bond pad includes connecting a wire to the first bond pad.

3. The method of claim 1, wherein attaching the first conductive lead to the first bond pad includes attaching the first conductive lead to the first bond pad with a ball bond by forming an enlarged portion proximate to the first end of the first conductive lead and applying at least one of the heat and pressure to the enlarged portion.

4. The method of claim 1 wherein attaching the first conductive lead to the first bond pad includes attaching the first conductive lead to the first bond pad with a wedge bond by forcing the first conductive lead against the first bond pad to deform the first conductive lead.

5. The method of claim 1, further comprising positioning an electrically insulating material between at least one of the first and second conductive leads and the surface of the microelectronic device.

6. The method of claim 1 wherein attaching the first conductive lead to the first bond pad includes applying a conductive flowable material between the first and second bond pads.

7. The method of claim 1 wherein attaching the first conductive lead to the first bond pad includes connecting to the first bond pad an approximately flat metal layer.

8. The method of claim 1 wherein attaching the first conductive lead to the second bond pad includes spacing the first conductive lead apart from the surface of the semiconductor device.

9. The method of claim 1, further comprising attaching a conductive element to one of the first and second bond pads such that at least a portion of the conductive element extends beneath the surface of the semiconductor device.

10. The method of claim 1 wherein attaching the second conductive lead to the one bond pad includes attaching the second conductive lead to a portion of the first conductive lead adjacent the one of the first and second bond pads.

11. A method for bonding first and second leads to a bond pad of a semiconductor device, comprising:
    coupling the first lead to the bond pad by engaging a first surface of the first lead with the bond pad and exposing a second surface substantially opposite the first surface; and
    coupling the second lead to the second surface of the first lead.

12. The method of claim 11 wherein coupling the first lead to the bond pad includes connecting the first lead to the bond pad with a wedge bond by forcing the first lead against the bond pad to deform the first lead.

13. The method of claim 11 wherein coupling the first lead to the bond pad includes connecting the first lead to the bond pad with a ball bond by forming an enlarged portion proximate to an end of the first lead and applying at least one of heat and pressure to the enlarged portion.

14. The method of claim 11 wherein coupling the second lead to the second surface includes connecting the second lead with a ball bond by forming an enlarged portion proximate to an end of the second lead and applying at least one of heat and pressure to the enlarged portion.

15. The method of claim 11 wherein coupling the second lead to the second surface includes connecting the second lead with a wedge bond by forcing the second lead against the second surface to deform the second lead.

16. The method of claim 11 wherein the bond pad is a first bond pad, the semiconductor device having a second bond pad spaced apart from the first bond pad, further comprising coupling the second lead to the second bond pad to extend between the first and second bond pads.

17. A method for bonding first and second leads to a bond pad of a semiconductor device, comprising:
    coupling the first lead to the bond pad with a wedge bond by forcing a side surface of the first lead against the bond pad to deform the side surface of the first lead; and
    coupling the second lead to the wedge bond by forming an enlarged portion proximate to an end of the second lead and applying at least one of heat and pressure to the enlarged portion.

18. The method of claim 17 wherein coupling the first lead includes squeezing the first lead between a tool and the bond pad to disconnect a portion of the first lead connected to the bond pad from a remaining portion of the first lead.

19. The method of claim 17 wherein coupling the first lead includes cutting the first lead to disconnect a portion of the first lead connected to the bond pad from a remaining portion of the first lead.

20. A method for bonding first and second leads to a bond pad of a semiconductor device, comprising:

coupling the first lead to the bond pad with a ball bond by forming an enlarged portion proximate to an end of the first lead and applying at least one of heat and pressure to the enlarged portion; and coupling the second lead to the ball bond by with a wedge bond by forcing the second lead against the ball bond to deform the second lead.

21. The method of claim 20 wherein coupling the second lead includes squeezing the second lead between a tool and the ball bond to disconnect a portion of the second lead connected to the ball bond from a remaining portion of the first lead.

22. The method of claim 20 wherein coupling the second lead includes cutting the second lead to disconnect a portion of the second lead connected to the ball bond from a remaining portion of the first lead.

23. A method for bonding first and second leads to a bond pad of a semiconductor device, comprising:

coupling the first lead to the bond pad with a first wedge bond by forcing the first lead against the bond pad; and coupling the second lead to the first wedge bond with a second wedge bond by forcing the second lead against the first wedge bond to deform the second lead.

24. The method of claim 23 wherein coupling the first lead includes squeezing the first lead between a tool and the bond pad to disconnect a portion of the first lead connected to the bond pad from a remaining portion of the first lead.

25. The method of claim 23 wherein coupling the first lead includes cutting the first lead to disconnect a portion of the first lead connected to the bond pad from a remaining portion of the first lead.

26. The method of claim 23 wherein coupling the second lead includes squeezing the second lead between a tool and the first lead to disconnect a portion of the second lead connected to the first lead from a remaining portion of the second lead.

27. The method of claim 23 wherein coupling the second lead includes cutting the second lead to disconnect a portion of the second lead connected to the first lead from a remaining portion of the second lead.

* * * * *

UNITED STATES PATENT AND TRADEMARK OFFICE
CERTIFICATE OF CORRECTION

PATENT NO.    : 6,602,778 B2
DATED         : August 5, 2003
INVENTOR(S)   : Troy A. Manning and Michael B. Ball It is certified that error appears in the above-identified patent and that said Letters Patent is hereby corrected as shown below:

Title page,
Item [56], U.S. PATENT DOCUMENTS, should read -- 6,192,578 2/2001 Manning ........228/1.1 --

Coumn 1,
Line 11, reads "Jan. 2,2001." should read -- Jan. 2, 2001 --

Column 7,
Line 55, reads "in copending" should read -- in co-pending --

Column 11,
Line 17, reads "ball bond by with a wedge" should read -- ball bond with a wedge --

Signed and Sealed this

Sixth Day of July, 2004

JON W. DUDAS
*Acting Director of the United States Patent and Trademark Office*